United States Patent
Rofougaran

(10) Patent No.: US 7,724,096 B2
(45) Date of Patent: May 25, 2010

(54) METHOD AND SYSTEM FOR SIGNAL GENERATION VIA A PLL WITH UNDERSAMPLED FEEDBACK

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 11 days.

(21) Appl. No.: 11/864,843

(22) Filed: Sep. 28, 2007

(65) Prior Publication Data

US 2009/0085675 A1 Apr. 2, 2009

(51) Int. Cl.
  *H03B 19/14* (2006.01)
  *H03L 7/18* (2006.01)
(52) U.S. Cl. ............................ 331/51; 331/17; 375/376
(58) Field of Classification Search ................... 331/17, 331/25, 51; 375/376
  See application file for complete search history.

(56) References Cited

U.S. PATENT DOCUMENTS

| | | | |
|---|---|---|---|
| 5,130,671 A | 7/1992 | Shahriary et al. | |
| 6,069,505 A | 5/2000 | Babanezhad | |
| 6,181,218 B1 | 1/2001 | Clark et al. | |
| 6,198,353 B1 * | 3/2001 | Janesch et al. | 331/16 |
| 6,366,174 B1 | 4/2002 | Berry et al. | |
| 6,463,112 B1 * | 10/2002 | Hafez et al. | 375/376 |
| 6,628,163 B2 | 9/2003 | Dathe et al. | |
| 6,646,581 B1 | 11/2003 | Huang | |
| 6,791,425 B2 | 9/2004 | Kitamura | |
| 6,836,154 B2 | 12/2004 | Fredriksson | |
| 6,842,710 B1 | 1/2005 | Gehring et al. | |
| 7,317,363 B2 | 1/2008 | Kousai et al. | |
| 7,356,423 B2 | 4/2008 | Nehrig | |
| 7,432,751 B2 | 10/2008 | Fang | |
| 2005/0253646 A1 | 11/2005 | Lin | |
| 2008/0258806 A1 | 10/2008 | Youssoufian et al. | |

* cited by examiner

*Primary Examiner*—Robert Pascal
*Assistant Examiner*—James E Goodley
(74) *Attorney, Agent, or Firm*—McAndrews, Held & Malloy, Ltd.

(57) ABSTRACT

Aspects of a method and system for signal generation via a PLL with undersampled feedback are provided. In this regard, the output of a VCO may clock a DDFS to generate a sampling frequency, and the output of the VCO may be undersampled at the sampling frequency to generate a feedback signal for controlling the VCO. Additionally, a control word for controlling the DDFS may be generated, and may be based on a phase difference between the feedback signal and a reference signal. The sampling frequency may be determined such that an aliasing product of the undersampling occurs at a frequency of the reference signal. Also, the feedback signal may be filtered to select a desired aliasing product from a plurality of aliasing products. The output of the VCO may be frequency divided before clocking the DDFS, and a divisor of the division may be programmatically controlled.

21 Claims, 6 Drawing Sheets

METHOD AND SYSTEM FOR SIGNAL GENERATION VIA A PLL WITH UNDERSAMPLED FEEDBACK

CROSS-REFERENCE TO RELATED APPLICATIONS/INCORPORATION BY REFERENCE

This application makes reference to: U.S. application Ser. No. 11/860,076, filed on Sep. 24, 2007; U.S. application Ser. No. 11/860,106, filed on Sep. 24, 2007; U.S. application Ser. No. 11/860,128, filed on Sep. 24, 2007; U.S. application Ser. No. 11/863,871, filed on Sep. 28, 2007; U.S. application Ser. No. 11/864,839, filed on Sep. 28, 2007; U.S. application Ser. No. 11/860,152, filed on Sep. 24, 2007; U.S. application Ser. No. 11/863,531, filed on Sep. 28, 2007; U.S. application Ser. No. 11/860,174, filed on Sep. 24, 2007; and U.S. application Ser. No. 11/857,067, filed on Sep. 18, 2007.

Each of the above stated applications is hereby incorporated herein by reference in its entirety.

FIELD OF THE INVENTION

Certain embodiments of the invention relate to signal processing. More specifically, certain embodiments of the invention relate to a method and system for signal generation via a PLL with undersampled feedback.

BACKGROUND OF THE INVENTION

As wireless communications continue to evolve and become increasingly relied upon for the conveyance of data, new challenges continue to face wireless system designers. In this regard, the increasing number of wireless technologies and wireless devices has led to increasing congestion in many frequency bands. Accordingly, efforts exist to utilize less congested frequency bands. For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'. However, in order to transmit, receive, and/or process signals with such high frequencies as 60 GHz, new methods and systems for signal generation are necessary. In this regard, conventional methods of signal generation, such as integer-N and Fractional-N phase locked loops may be difficult or costly to implement as frequencies increase.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for signal generation via a PLL with undersampled feedback, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Aspects of a method and system for signal generation via a PLL with undersampled feedback are provided. In this regard, the output of a VCO may clock a direct digital frequency synthesizer (DDFS) to generate a sampling frequency, and the output of the VCO may be undersampled at the sampling frequency to generate a feedback signal for controlling the VCO. Additionally, a control word for controlling the DDFS may be generated, and may be based on a phase difference between the feedback signal and a reference signal. The sampling frequency may be determined such that an aliasing product of the undersampling occurs at a frequency of the reference signal. Also, the feedback signal may be filtered to select a desired aliasing product from a plurality of aliasing products. The output of the VCO may be frequency divided before clocking the DDFS, and a divisor of the division may be programmatically controlled.

Figure 1:
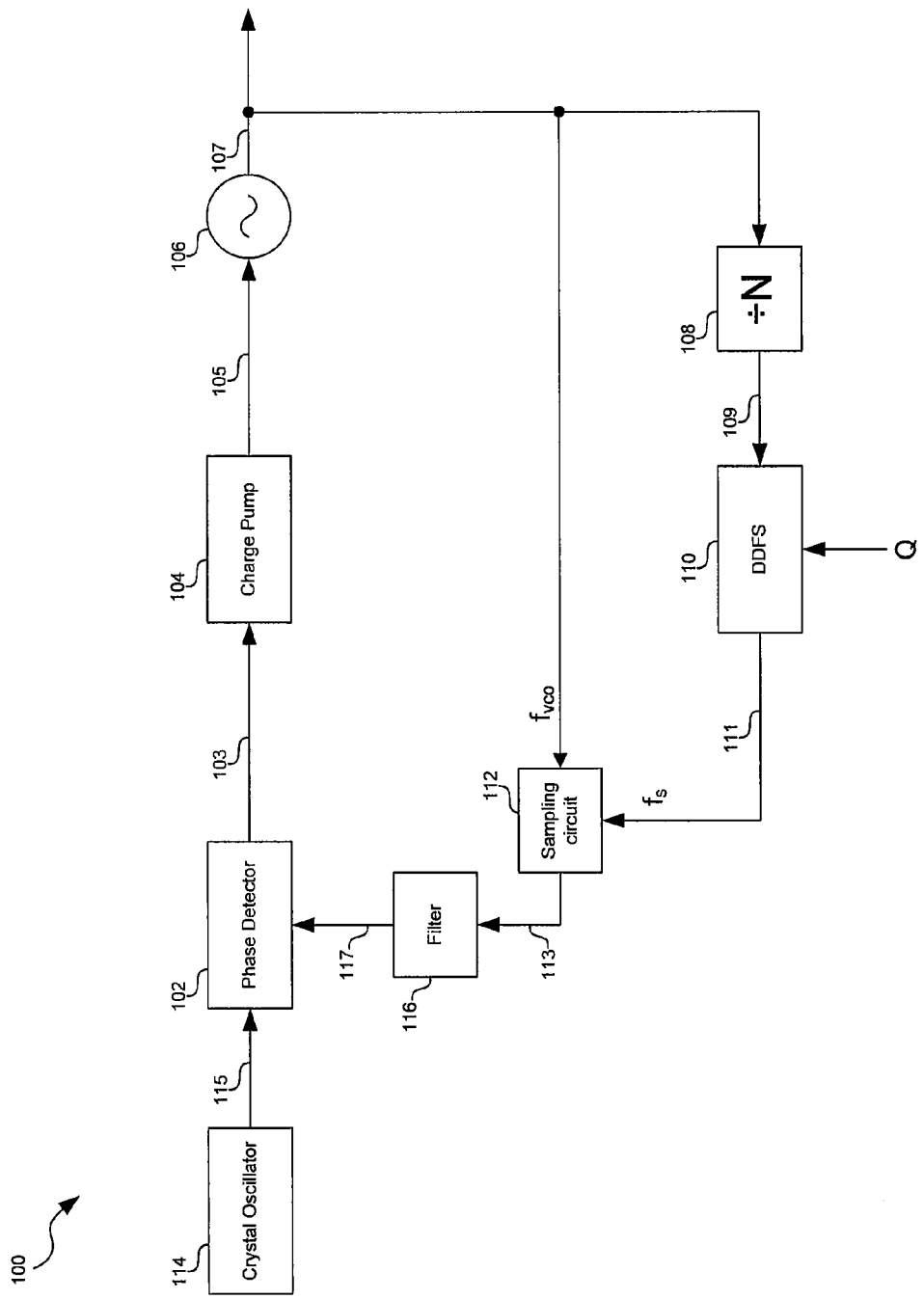
FIG. 1 is a block diagram illustrating an exemplary PLL with undersampled feedback, in accordance with an embodiment of the invention.

FIG. 1 is a block diagram illustrating an exemplary PLL with a DDFS in the feedback path, in accordance with an embodiment of the invention. Referring to FIG. 1 an exemplary local oscillator generator (LOGEN) 100 may comprise a crystal oscillator 114, a phase detector 102, a charge pump 104, a voltage controlled oscillator (VCO) 106, a frequency divider 108, a DDFS 110, and a level restoration-/-limiting block 112.

The crystal oscillator 114 may comprise suitable logic, circuitry, and/or code that may enable generating a stable reference frequency.

The phase detector 102 may comprise suitable logic, circuitry, and/or code that may enable generating one or more signals based on a phase difference between two signals. In this regard, the signals 113 and 115 may be input to the phase detector 102 and the signal 103 may be output. Accordingly, the signal 103 may be based on a phase difference between the signals 113 and 115. In various embodiments of the invention, the phase detector 102 may perform a multiplication of the signals 113 and 115 and the signal 103 may be a product of the multiplication. In this regard, the average voltage of the signal 103 may be proportional to the phase difference between the signals 113 and 115. In this regard, a constant 90° offset may be added to the signal 113 or the signal 115 such that when the signals 113 and 115 are in-phase, the product (signal 103) may have an average voltage of 0 volts.

The charge pump 104 may comprise suitable logic, circuitry, and/or code that may enable adjusting a control voltage 105 of the VCO 106 based on the error signal 103. For example, the charge pump 104 may increase the voltage 105 when the error signal 103 indicates that signal 113 is lagging the signal 115. Similarly, the charge pump 104 may decrease the voltage 105 when the error signal 103 indicates that signal 113 is leading the signal 115.

The VCO 106 may comprise suitable logic, circuitry, and/or code that may enable generating a signal 107 based on a control voltage 105. In this regard, the frequency of the signal 107 may be determined, at least in part, by the voltage 105.

The frequency divider 108 may comprise suitable logic, circuitry, and/or code for receiving a first, higher, frequency and outputting a second, lower, frequency. The scaling factor, N, may be determined based on one or more control signals from, for example, the processor 625 of FIG. 6.

Figure 4:
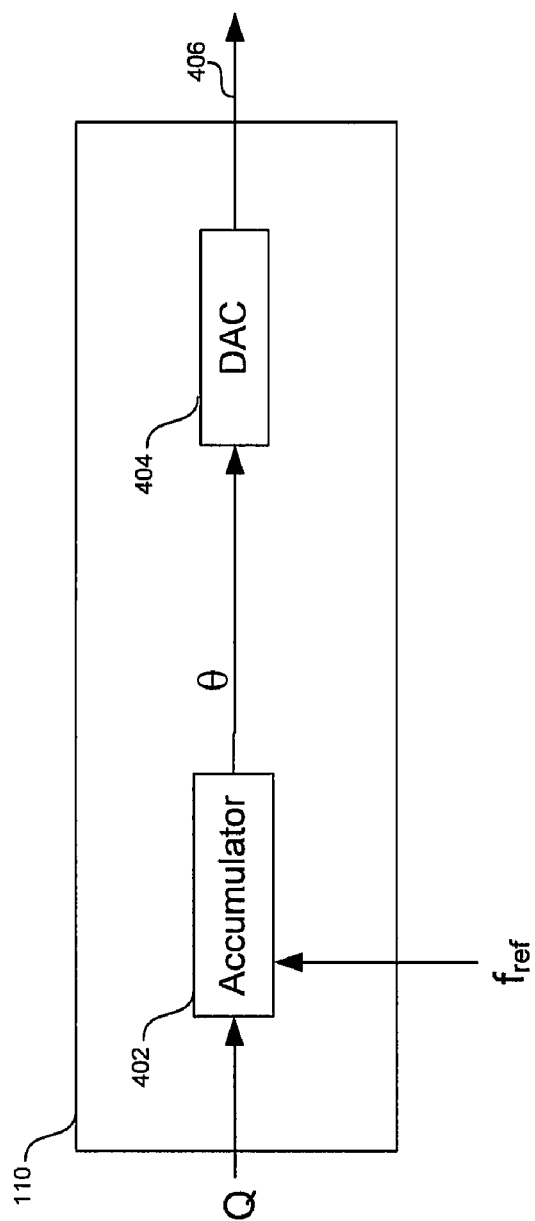
FIG. 4 is a block diagram of a direct digital frequency synthesizer, in accordance with an embodiment of the invention.

The DDFS 110 may comprise suitable logic, circuitry, and/or code that may enable generation of signals based on a digital control word and a reference signal. The control word may be generated by the processor 625 or the processor 629 of FIG. 6. FIG. 4 illustrates details of an exemplary DDFS block.

The sampling circuit 112 may comprise suitable logic, circuitry, and/or code that may enable sampling the signal 107 at times determined by the signal 111. In this regard, the sampling circuit 112 may enable aliasing the signal 107 down to the reference frequency 115.

The filter 114 may comprise suitable logic, circuitry, and/or code that may enable passing a desired aliasing product output by the sampling circuit 112. In this regard, the filter 114 may comprise, for example, a low-pass or band-pass filter. Additionally, a bandwidth and/or center frequency of the filter 114 may be tunable. In this regard, the filter may receive one or more control signals from, for example, the processor 625 of FIG. 6.

In operation the LOGEN 100 may generate a signal 107 of variable frequency with has the stability of the fixed frequency reference signal 115 from the crystal oscillator 114. In this regard, the DDFS 110 may enable generation of a signal 111 based on the signal 109 and the control word Q. The signal 111 may be a sampling clock input to the sampling circuit 112. The frequency of the signal 111 may be determined utilizing the following equation:

$$f_{111} = \frac{f_{107}}{N} \cdot Q \cdot \frac{1}{2^n}$$ EQ. 1 where $f_{111}$ is the frequency of the signal 111, $f_{107}$ is the frequency of the signal 107, N is the divide ratio of the frequency divider 108, Q is the value of the control word input to the DDFS 110, and 'n' is the number of bits of the accumulator 110. Thus, by undersampling the signal 107 at the frequency $f_{111}$, the signal 117 may be determined utilizing the following equation:

$$f_{117} = f_{107} - f_{111} \cdot K$$ EQ. 2 where the filter 116 may be tuned to the frequency $f_{117}$ such that other aliasing products, resulting from other values of K, for example, are filtered out. Combining EQ. 1 and EQ. 2 yields an expression for $f_{117}$ in terms of $f_{107}$:

$$f_{117} = f_{107}\left(1 - \frac{K}{N} \cdot \frac{Q}{2^n}\right)$$ EQ. 3

Accordingly, the LOGEN 100 may be enabled to generate a wide range of frequencies, with high resolution, without the need of a traditional fractional-N synthesizer.

Figure 2A:
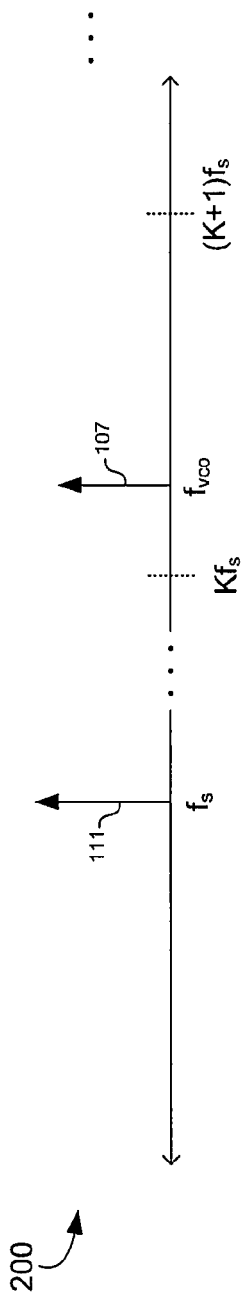
FIG. 2a is a diagram illustrating an exemplary spectrum of the sampling circuit inputs, in accordance with an embodiment of the invention.

FIG. 2*a* is a diagram illustrating an exemplary spectrum of the sampling circuit inputs, in accordance with an embodiment of the invention. Referring to FIG. 2*a*, the exemplary spectrum 200 comprises the signal 111 located at $f_s$, and the signal 107 located at $f_{vco}$.

In an exemplary embodiment of the invention, each of the K harmonics of the sampling frequency may generate aliasing products $f_{vco}-(K)f_s$. Accordingly, after undersampling, the signal 107 may be aliased to frequencies $|f_{vco}-(K)f_s|$, for K≧1, as illustrated below in FIG. 2*b*. Accordingly, by tuning the filter 116, the desired alias product, which may be equal to the reference frequency 115, may be passed to the signal 117 while other aliasing products may be filtered out.

Figure 2B:
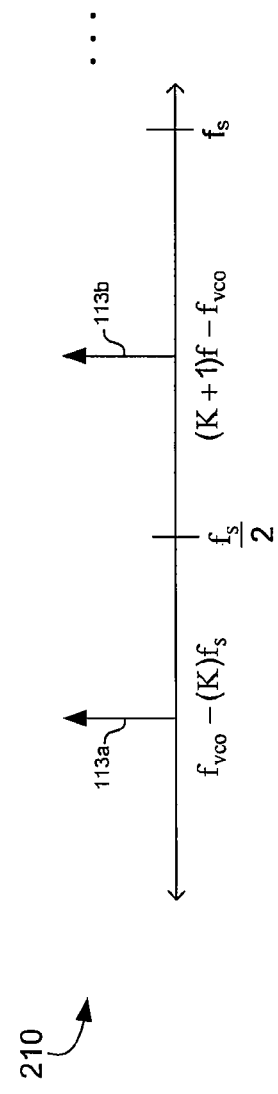
FIG. 2b is a diagram illustrating an exemplary spectrum of the sampling circuit outputs, in accordance with an embodiment of the invention.

FIG. 2*b* is a diagram illustrating an exemplary spectrum of the sampling circuit outputs, in accordance with an embodiment of the invention. Referring to FIG. 2*b*, the exemplary spectrum 210 illustrates some aliasing products resulting from undersampling the signal 107 at $f_{vco}$ by the signal 111 at $f_s$. In an exemplary embodiment of the invention, the filter 116 may be tuned to pass the signal at $f_{vco}-(K)f_s$.

Figure 3:
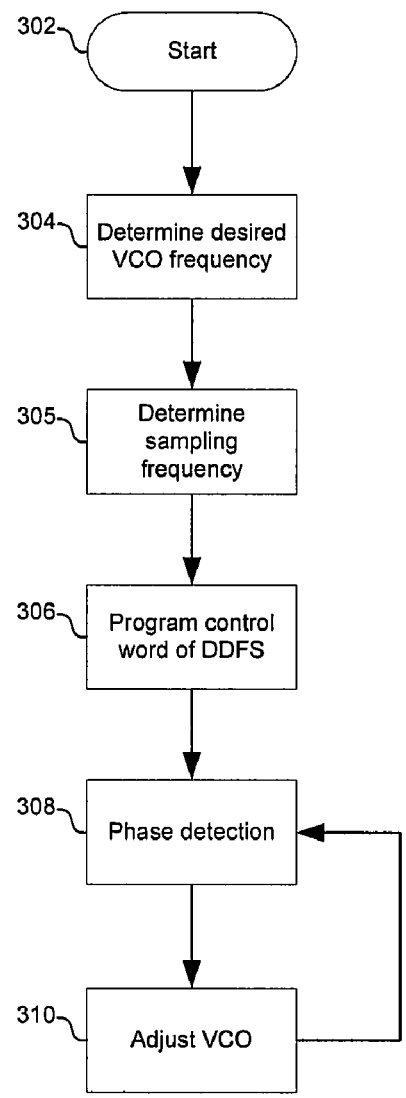
FIG. 3 is a flow chart illustrating exemplary steps for generating a signal via a PLL with DDFS feedback path, in accordance with an embodiment of the invention.

FIG. 3 is a flow chart illustrating exemplary steps for generating a signal via a PLL with undersampled feedback, in accordance with an embodiment of the invention. Referring to FIG. 3, the exemplary steps may begin with start step 302. Subsequent to start step 302, the exemplary steps may advance to step 304. In step 304, a desired frequency to be output by the VCO 106 may be determined. In this regard, if the LOGEN 100 is being utilized to transmit or receive RF signals, then the output of the VCO 106 may be determined based on the RF transmit and/or RF receive frequency. Subsequent to step 304, the exemplary steps may advance to step 305. In step 305 a sampling frequency may be determined such that, at the output of the sampling circuit 112, an aliasing product of the signal 107 is generated at the reference frequency 115. Subsequent to step 305, the exemplary steps may advance to step 306.

In step 306, the digital control word input to the DDFS 110 may be determined. In this regard, the value of the digital control word may be determined utilizing EQ. 3 above. Accordingly, for different values of the reference frequency 115 and/or the desired output frequency 107, the value of the digital output word may be adjusted. In this regard, a processor, such as the processor 625 or the processor 629 of FIG. 6, may programmatically control the value of the digital control word. Subsequent to step 306, the exemplary steps may advance to step 308. In step 308, a phase difference between the signal 113 and the signal 115 may be determined. Subsequent to step 308, the exemplary steps may advance to step 310. In step 310, the VCO 106 may be adjusted based on the phase difference between the signals 113 and 115. For example, the voltage across a varactor may be adjusted to increase or decrease the output frequency of the VCO 106, such that the phase difference between the signals 113 and 115 may be reduced. Accordingly, when there may be no phase difference between the signals 113 and 115 the PLL may be said to be "locked". Subsequent to step 310, the exemplary steps may return to step 308. In this regard, maintaining phase lock may be a continuous process that requires periodic or even constant feedback.

FIG. 4 is a block diagram of a direct digital frequency synthesizer, in accordance with an embodiment of the invention. Referring to FIG. 4, the DDFS block 110 may comprise an accumulator 402 and a digital to analog conversion (DAC) block 404.

The accumulator 402 may comprise suitable logic, circuitry, and/or code that may enable successively adding a control word Q to a value stored in the accumulator on each cycle of a reference clock. The accumulator may receive the control word Q from a processor, such as the processor 625 described in FIG. 6. The accumulator 402 may also receive a reference signal, $f_{ref}$. In this regard, the control word Q and the reference signal $f_{ref}$ may determine a phase and/or a frequency of the output signal 406.

The DAC block 404 may comprise suitable logic, circuitry, and and/or code that may enable output of a signal of varying phase, frequency, or amplitude. In one embodiment or the invention, the DAC block 404 may comprise a number of lookup tables used to generate output signals, which may drive one or more power amplifiers, such as the amplifier 508 described in FIG. 5.

In operation, the DDFS block 110 may be a digitally-controlled signal generator that may vary a phase, a frequency, and/or an amplitude of one or more output signals based on a single fixed-frequency reference clock, $f_{ref}$, and a control word Q. In operation, the control word may be provided to the accumulator 402, and may be successively added to a value stored in the accumulator on each cycle of the signal 109. In this manner, the sum will eventually be greater than the maximum value the accumulator may store, and the value in the accumulator may overflow or "wrap". Accordingly, an N-bit accumulator will overflow at a frequency $f_o$ given by EQ. 2.

$$f_o = f_{ref}(Q/2^N)$$  EQ. 2

In this manner, the output of the accumulator, θ, may be periodic with period $1/f_o$ and may represent the phase angle of a signal. Providing this phase angle to the DAC block 204 may then allow generation of one or more signals of varying phase, frequency and amplitude. In this regard, the DDFS block 110 may be well suited as a frequency generator that outputs one or more sine waves or other periodic waveforms over a large range of frequencies, from almost DC to approximately half the reference clock frequency $f_{ref}$.

Figure 5:
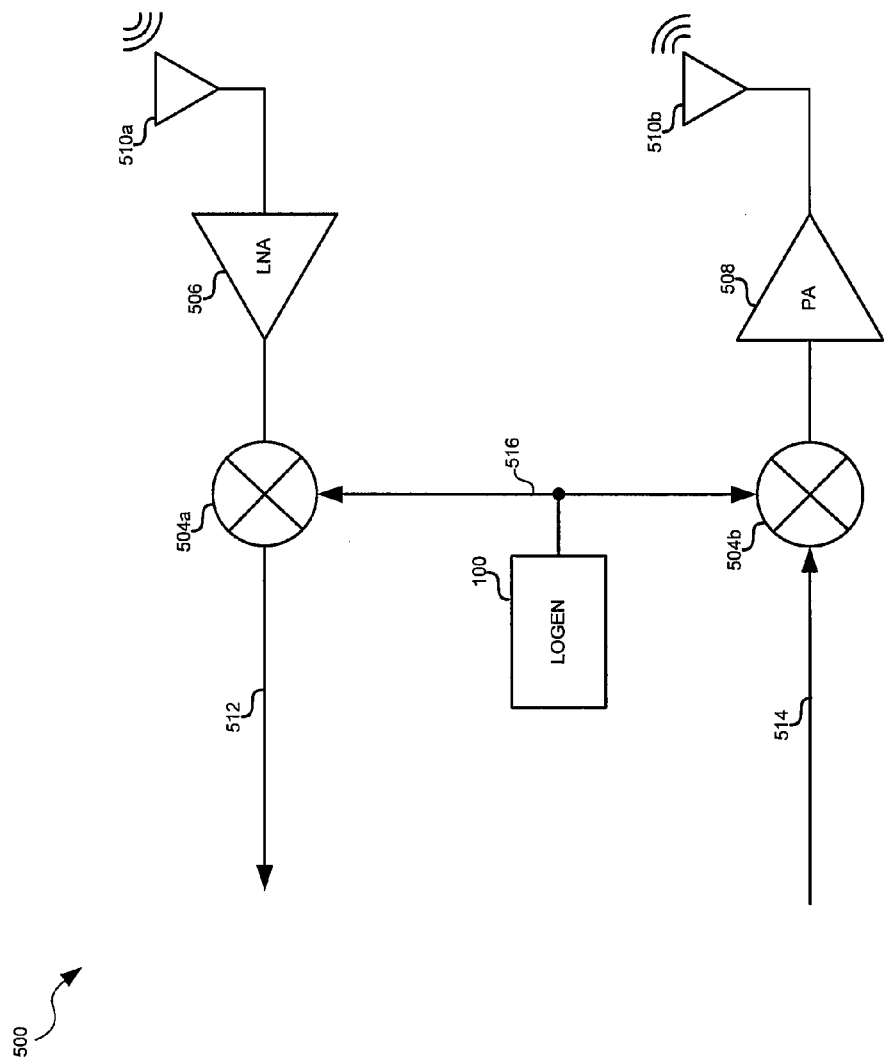
FIG. 5 is a diagram of a transceiver, in accordance with an embodiment of the invention.

FIG. 5 is a diagram of a transceiver, in accordance with an embodiment of the invention. Referring to FIG. 5 there is shown a transceiver 500 which may be all or a portion of the RF receiver 623a, for example. The transceiver 500 may comprise local oscillator generator (LOGEN) 100, mixers 504a and 504b, a low noise amplifier (LNA) 506, a power amplifier 508, antennas 510a and 510b, and PA calibration block 512.

The LOGEN 100 may comprise suitable logic, circuitry, and/or code that may enable generating a reference signal. In this regard, the LOGEN 100 may comprise a phase locked loop (PLL) which may have a direct digital frequency synthesizer (DDFS) in a feedback path. In an exemplary embodiment, of the invention, the transceiver 500 may directly convert between RF and baseband. Accordingly, the frequency of the signal 516, $F_{LO}$, may be ($F_{RF} \pm F_{baseband}$).

The mixer 504a may comprise suitable logic, circuitry, and/or code that may enable generation of inter-modulation products resulting from mixing the output of the LNA 506 and the LO signal 516. Similarly, the mixer 504b may comprise suitable logic, circuitry, and/or code that may enable generation of inter-modulation products resulting from mixing the baseband signal 514 and the LO signal 516. In various embodiments of the invention the output of the mixers may be filtered such that desired inter-modulation products are passed with less attenuation than undesired inter-modulation products.

The LNA 506 may comprise suitable logic, circuitry, and/or code that may enable buffering and/or amplification of received RF signals. In this regard, the gain of the LNA 506 may be adjustable to enable reception of signals of varying strength. Accordingly, the LNA 506 may receive one or more control signals from a processor such as the processors 625 and 629 of FIG. 6.

The PA 508 may comprise suitable logic, circuitry, and/or code that may enable buffering and/or amplification of a RF signal and outputting the signal to an antenna for transmission. In this regard, the gain of the PA 508 may be adjustable and may enable transmitting signals of varying strength. Accordingly, the PA 508 may receive one or more control signals from a processor such as the processors 625 and 629 of FIG. 6.

The antennas 510a and 510b may comprise suitable logic, circuitry, and/or code that may enable reception and/or transmission of signals of up to EHF. In various embodiments of the invention there may be separate transmit and receive antennas, as depicted, or there may be a single antenna for both transmit and receive functions.

In an exemplary receive operation, RF signals may be received by the antenna 510a and may be conveyed to the LNA 506. The LNA 506 may amplify the received signal and convey it to the mixer 504a. In this regard, the gain of the LNA may be adjusted based on received signal strength. Additionally, the gain may be controlled via one or more control signals from, for example, a processor such as the processors 625 and 629 of FIG. 6. The LO signal 416 may be coupled to the mixer 504a such that the received signal of frequency $F_{RF}$ may be down-converted to a baseband signal 512. The baseband signal 512 may be conveyed, for example, to a baseband processor such as the baseband processor 629 of FIG. 6.

In an exemplary transmit operation, a baseband signal 514 may be conveyed to the mixer 504b. The LO signal 416 may be coupled to the mixer 504b and the baseband signal 514, of frequency $F_{baseband}$, may be up-converted to RF. The RF signal may be conveyed to the PA 508 for transmission via the antenna 510b. In this regard, the gain of the PA 508 may be adjusted via one or more control signals from, for example, a processor such as the processors 625 and 629 of FIG. 6.

Figure 6:
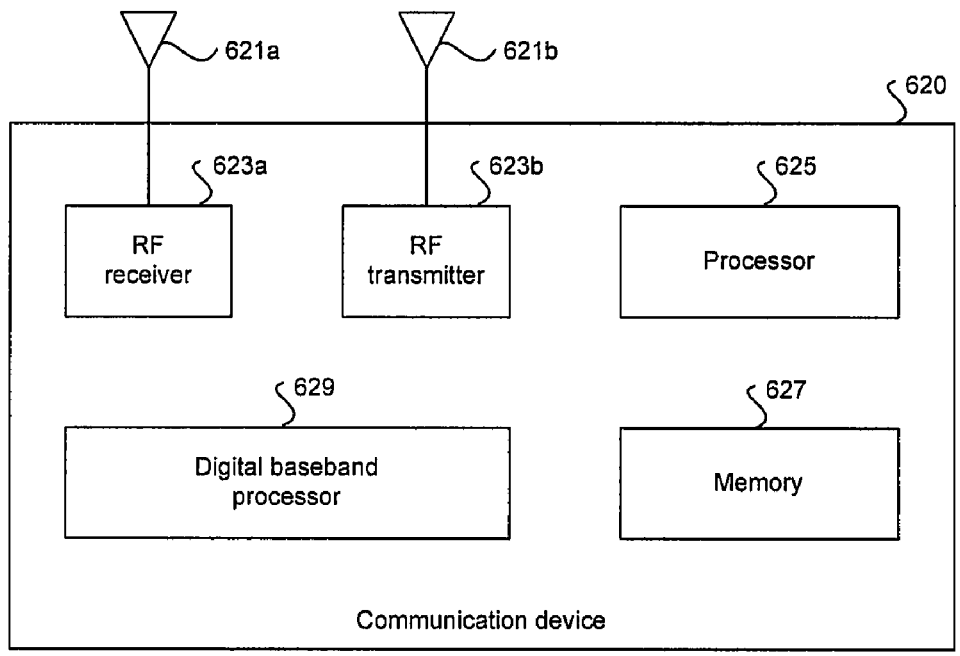
FIG. 6 is a block diagram illustrating an exemplary RF communication device, in accordance with an embodiment of the invention.

FIG. 6 is a block diagram illustrating an exemplary RF communication device, in accordance with an embodiment of the invention. Referring to FIG. 6, there is shown a RF communication device 620 that may comprise an RF receiver 623a, an RF transmitter 623b, a digital baseband processor 629, a processor 625, and a memory 627. A receive antenna 621a may be communicatively coupled to the RF receiver 623a. A transmit antenna 621b may be communicatively coupled to the RF transmitter 623b. The RF communication device 620 may be operated in a system, such as the cellular network and/or digital video broadcast network, for example.

The RF receiver 623a may comprise suitable logic, circuitry, and/or code that may enable processing of received RF signals. In this regard, the receiver may be enabled to generate signals, such as local oscillator signals, for the reception and processing of RF signals. The RF receiver 623a may down-convert received RF signals to a baseband frequency signal. The RF receiver 623a may perform direct down-conversion of the received RF signal to a baseband frequency signal, for example. In some instances, the RF receiver 623a may enable analog-to-digital conversion of the baseband signal components before transferring the components to the digital baseband processor 629. In other instances, the RF receiver 623a may transfer the baseband signal components in analog form.

The digital baseband processor 629 may comprise suitable logic, circuitry, and/or code that may enable processing and/ or handling of baseband frequency signals. In this regard, the digital baseband processor 629 may process or handle signals received from the RF receiver 623a and/or signals to be transferred to the RF transmitter 623b. The digital baseband processor 629 may also provide control and/or feedback information to the RF receiver 623a and to the RF transmitter 623b based on information from the processed signals. In this regard, the baseband processor 629 may provide control signals to one or more of the crystal oscillator 114, the phase detector 102, the charge pump 104, the oscillator 106, the frequency divider 108, the DDFS 110, the sampling circuit 112 and/or the filter 116. The digital baseband processor 629 may communicate information and/or data from the processed signals to the processor 625 and/or to the memory 627. Moreover, the digital baseband processor 629 may receive information from the processor 625 and/or to the memory 627, which may be processed and transferred to the RF transmitter 623b for transmission to the network.

The RF transmitter 623b may comprise suitable logic, circuitry, and/or code that may enable processing of RF signals for transmission. In this regard, the transmitter may be enabled to generate signals, such as local oscillator signals, for the transmission and processing of EHF signals. The RF transmitter 623b may up-convert the baseband frequency signal to an RF signal. The RF transmitter 623b may perform direct up-conversion of the baseband frequency signal to a RF signal of approximately 60 GHz, for example. In some instances, the RF transmitter 623b may enable digital-to-analog conversion of the baseband signal components received from the digital baseband processor 629 before up conversion. In other instances, the RF transmitter 623b may receive baseband signal components in analog form.

The processor 625 may comprise suitable logic, circuitry, and/or code that may enable control and/or data processing operations for the RF communication device 620. The processor 625 may be utilized to control at least a portion of the RF receiver 623a, the RF transmitter 623b, the digital baseband processor 629, and/or the memory 627. In this regard, the processor 625 may generate at least one signal for controlling operations within the RF communication device 620. In this regard, the processor 625 may provide control signals to one or more of the crystal oscillator 114, the phase detector 102, the charge pump 104, the oscillator 106, the frequency divider 108, the DDFS 110, the sampling circuit 112 and/or the filter 116. The processor 625 may also enable executing of applications that may be utilized by the RF communication device 620. For example, the processor 625 may execute applications that may enable displaying and/or interacting with content received via RF signals in the RF communication device 620.

The memory 627 may comprise suitable logic, circuitry, and/or code that may enable storage of data and/or other information utilized by the RF communication device 620. For example, the memory 627 may be utilized for storing processed data generated by the digital baseband processor 629 and/or the processor 625. The memory 627 may also be utilized to store information, such as configuration information, that may be utilized to control the operation of at least one block in the RF communication device 620. For example, the memory 627 may comprise information necessary to configure the RF receiver 623a to enable receiving signals in the appropriate frequency band. In this regard, the memory 627 may store control and/or configuration data for one or more of the crystal oscillator 114, the phase detector 102, the charge pump 104, the oscillator 106, the frequency divider 108, the DDFS 110, the sampling circuit 112 and/or the filter 116.

Aspects of a method and system for signal generation via a PLL with undersampled feedback are provided. In this regard, the output of a VCO 106 may clock a DDFS 110 to generate a sampling frequency, and the output of the VCO 106 may be undersampled at the sampling frequency to generate a feedback signal 117 for controlling the VCO. Additionally, a control word, Q, for controlling the DDFS may be generated, and may be based on a phase difference between the feedback signal 117 and a reference signal 115. The sampling frequency may be determined such that an aliasing product of the undersampling occurs at a frequency of the reference signal. Also, the feedback signal may be filtered to select a desired aliasing product from a plurality of aliasing products. The output of the VCO 106 may be frequency divided before clocking the DDFS, and a divisor, N, of the division may be programmatically controlled.

Another embodiment of the invention may provide a machine-readable storage, having stored thereon, a computer program having at least one code section executable by a machine, thereby causing the machine to perform the steps as described herein for <<<title>>>.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
   generating a sampling frequency via a direct digital frequency synthesizer (DDFS); and
   generating a feedback signal for controlling a voltage controlled oscillator (VCO) by undersampling an output of said VCO signal at said generated sampling frequency, wherein said DDFS is clocked by said output of said VCO.

2. The method according to claim 1, comprising generating a digital control word to control said DDFS.

3. The method according to claim 1, comprising controlling said VCO based on a phase difference between said feedback signal and a reference signal.

4. The method according to claim 3, comprising determining said sampling frequency such that an aliasing product of said undersampling occurs at a frequency of said reference signal.

5. The method according to claim 1, comprising frequency dividing said output of said voltage controlled oscillator prior to said clocking of said VCO.

6. The method according to claim 5, comprising programmatically controlling a divisor utilized for said frequency division.

7. The method according to claim 1, comprising filtering said generated feedback signal to select a desired aliasing product from a plurality of aliasing products.

8. A machine-readable storage having stored thereon, a computer program having at least one code section for signal processing, the at least one code section being executable by a machine for causing the machine to perform steps comprising:
  generating a sampling frequency, via a direct digital frequency synthesizer (DDFS); and
  generating a feedback signal for controlling a voltage controlled oscillator (VCO) by undersampling an output of said VCO signal at said generated sampling frequency,
  wherein said DDFS is clocked by said output of said VCO.

9. The machine-readable storage according to claim 8, wherein said at least one code section enables generating a digital control word to control said DDFS.

10. The machine-readable storage according to claim 8, wherein said at least one code section comprises code that enables controlling said VCO based on a phase difference between said feedback signal and a reference signal.

11. The machine-readable storage according to claim 10, wherein said at least one code section comprises code that enables determining said undersampling frequency such that an aliasing product of said sampling occurs at a frequency of said reference signal.

12. The machine-readable storage according to claim 8, wherein said at least one code section comprises code that enables frequency dividing said output of said voltage controlled oscillator prior to said clocking of said VCO.

13. The machine-readable storage according to claim 12, wherein said at least one code section comprises code that enables programmatically controlling a divisor utilized for said frequency division.

14. The machine-readable storage according to claim 8, wherein said at least one code section comprises code that enables filtering said generated feedback signal to select a desired aliasing product from a plurality of aliasing products.

15. A system for signal processing, the system comprising:
  one or more circuits comprising a direct digital frequency synthesizer (DDFS) that, at least:
    generate a sampling frequency, via said direct digital frequency synthesizer (DDFS); and
    generate a feedback signal for controlling a voltage controlled oscillator (VCO) by undersampling an output of said VCO signal at said generated sampling frequency,
    wherein said DDFS is clocked by said output of said VCO.

16. The system according to claim 15, wherein said one or more circuits generate a digital control word to control said DDFS.

17. The system according to claim 15, wherein said one or more circuits control said VCO based on a phase difference between said feedback signal and a reference signal.

18. The system according to claim 17, wherein said one or more circuits determine said sampling frequency such that an aliasing product of said undersampling occurs at a frequency of said reference signal.

19. The system according to claim 15, wherein said one or more circuits frequency divide said output of said voltage controlled oscillator prior to said clocking of said VCO.

20. The system according to claim 19, wherein said one or more circuits programmatically control a divisor utilized for said frequency division.

21. The system according to claim 15, wherein said one or more circuits filter said generated feedback signal to select a desired aliasing product from a plurality of aliasing products.

* * * * *